(12) United States Patent
Tseng et al.

(10) Patent No.: US 9,899,369 B2
(45) Date of Patent: Feb. 20, 2018

(54) LAYOUT STRUCTURE FOR ELECTROSTATIC DISCHARGE PROTECTION

(71) Applicant: UNITED MICROELECTRONICS CORP., Hsinchu (TW)

(72) Inventors: Pei-Shan Tseng, Hsinchu (TW); Yu-Cheng Liao, Yunlin County (TW); Ping-Chen Chang, Pingtung County (TW); Tien-Hao Tang, Hsinchu (TW); Kuan-Cheng Su, Taipei (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/860,788

(22) Filed: Sep. 22, 2015

(65) Prior Publication Data

US 2017/0084604 A1  Mar. 23, 2017

(51) Int. Cl.
 *H01L 27/02* (2006.01)
 *H01L 27/12* (2006.01)

(52) U.S. Cl.
 CPC ...... *H01L 27/0266* (2013.01); *H01L 27/0207* (2013.01); *H01L 27/0255* (2013.01); *H01L 27/1203* (2013.01)

(58) Field of Classification Search
 CPC .......... H01L 27/1203; H01L 21/84; H01L 29/66772; H01L 27/12; H01L 27/1214; H01L 27/0266; H01L 27/0207; H01L 27/0255; H01L 27/12
 See application file for complete search history.

(56) References Cited

U.S. PATENT DOCUMENTS

| | | | |
|---|---|---|---|
| 6,621,133 B1* | 9/2003 | Chen | H01L 27/0266 257/350 |
| 7,179,691 B1* | 2/2007 | Lee | H01L 27/0255 438/135 |
| 7,465,994 B2 | 12/2008 | Yu et al. | |
| 2003/0197246 A1* | 10/2003 | Ker | H01L 27/0259 257/565 |
| 2006/0097322 A1* | 5/2006 | Kwak | H01L 27/0262 257/355 |
| 2006/0157791 A1* | 7/2006 | Lee | H01L 27/0251 257/357 |
| 2009/0273033 A1* | 11/2009 | Wang | H01L 27/0266 257/362 |
| 2010/0019318 A1* | 1/2010 | Chao | H01L 29/7833 257/336 |

(Continued)

*Primary Examiner* — Allen Parker
*Assistant Examiner* — Long H Le
(74) *Attorney, Agent, or Firm* — WPAT, PC

(57) ABSTRACT

A layout structure is provided. The layout structure includes a substrate, a gate conductive layer, a first doped region having a first conductivity, a second doped region having the first conductivity, and a third doped region having a second conductivity. The gate conductive layer is formed on the substrate. The first doped region the second doped region are formed in the substrate and located at two sides of the gate conductive layer. The third doped region is formed in the substrate and adjacent to the second doped region. The third doped region and the second doped region form a diode. The gate conductive layer, the first doped region, and the third doped region are connected to ground, and the second doped region is connected to an input/output pad.

9 Claims, 5 Drawing Sheets

(56) References Cited

U.S. PATENT DOCUMENTS

| | | | |
|---|---|---|---|
| 2010/0148265 A1* | 6/2010 | Lin | H01L 29/735 257/355 |
| 2010/0163924 A1* | 7/2010 | Lin | H01L 27/0259 257/162 |
| 2012/0319189 A1* | 12/2012 | Wang | H01L 27/0251 257/328 |
| 2014/0203367 A1* | 7/2014 | Chen | H01L 29/861 257/355 |
| 2014/0339601 A1* | 11/2014 | Salcedo | H01L 27/0262 257/140 |

* cited by examiner

LAYOUT STRUCTURE FOR ELECTROSTATIC DISCHARGE PROTECTION

BACKGROUND

Technical Field

The disclosure relates in general to a layout structure, and more particularly to a layout structure with improved electrostatic discharge protection (ESD).

Description of the Related Art

Electrostatic discharge (ESD) has become one of the major issues affecting the stability and reliability of integrated circuits (IC). Despite the thermal dissipation disadvantages caused by the presence of a buried oxide in silicon-on-insulator (SOI) technology, a grounded-gate NMOS (GGNMOS) using SOI technology has been applied for improving ESD protection due to the advantages of low leakage, low capacitance, latch-up free, and etc.

However, the GGNMOS still cannot provide sufficient ESD protection. Therefore, there is still a continuing need to provide improved ESD protection of SOI technology.

SUMMARY OF THE INVENTION

The disclosure is directed to a layout structure. According to the embodiments of the present disclosure, the third doped region is formed in the substrate and adjacent to the second doped region, the two regions having complimentary conductivities, such that a diode formed from the third doped region and the second doped region is advantageous to the dissipation of ESD current, thereby improving the ESD protection without largely increasing the circuit size.

According to an embodiment of the present disclosure, a layout structure is disclosed. The layout structure includes a substrate, a gate conductive layer, a first doped region having a first conductivity, a second doped region having the first conductivity, and a third doped region having a second conductivity. The gate conductive layer is formed on the substrate. The first doped region and the second doped region are formed in the substrate and located at two sides of the gate conductive layer. The third doped region is formed in the substrate and adjacent to the second doped region. The third doped region and the second doped region form a diode. The gate conductive layer, the first doped region, and the third doped region are connected to ground, and the second doped region is connected to an input/output pad.

The disclosure will become apparent from the following detailed description of the preferred but non-limiting embodiments. The following description is made with reference to the accompanying drawings.

DETAILED DESCRIPTION OF THE INVENTION

Figure 1:
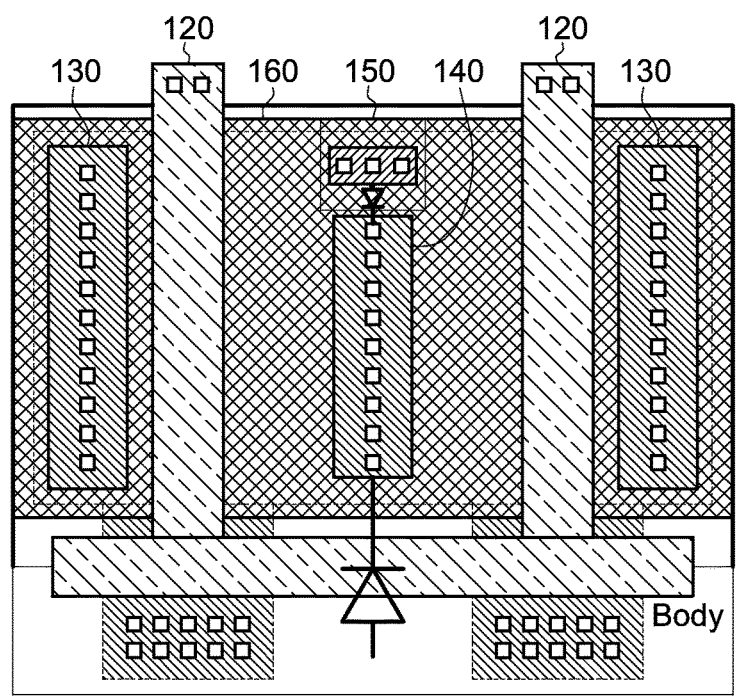
FIG. 1 is a top view of a layout structure according to an embodiment of the present disclosure.

According to the embodiments of the present disclosure, in the layout structure, the third doped region is formed in the substrate and adjacent to the second doped region, the two regions having complimentary conductivities, such that a diode formed from the third doped region and the second doped region is advantageous to the dissipation of ESD current, thereby improving the ESD protection without largely increasing the circuit size. The identical or similar elements of the embodiments are designated with the same reference numerals. It is to be noted that the drawings are simplified for clearly describing the embodiments, and the details of the structures of the embodiments are for exemplification only, not for limiting the scope of protection of the disclosure. Ones having ordinary skills in the art may modify or change the structures according to the embodiments of the present disclosure.

FIG. 1 is a top view of a layout structure 10 according to an embodiment of the present disclosure. As shown in FIG. 1, the layout structure 10 includes a substrate (not shown in FIG. 1), a gate conductive layer 120, a first doped region 130 having a first conductivity, a second doped region 140 having the first conductivity, and a third doped region 150 having a second conductivity. The gate conductive layer 120 is formed on the substrate. The first doped region 130 and the second doped region 140 are formed in the substrate and located at two sides of the gate conductive layer 120. The third doped region 150 is formed in the substrate and adjacent to the second doped region 140. The third doped region 150 and the second doped region 140 form a diode. The gate conductive layer 120, the first doped region 130, and the third doped region 150 are connected to ground, and the second doped region 140 is connected to an input/output pad.

The first conductivity is complimentary to the second conductivity. In an embodiment, the first conductivity is N type, and the second conductivity is P type. In an alternative embodiment, the first conductivity may be P type, and the second conductivity may be N type. In the embodiments, the gate conductive layer 120 may be formed of polysilicon or any suitable conductive material.

In the embodiments of the present disclosure, the layout structure forms such as a MOS device, the first doped region 130 is a source region, and the second doped region 140 is a drain region. The region under the gate conductive layer 120 and between the first doped region 130 (source region) and the second doped region 140 (drain region) is defined as a channel region. In the embodiments, the layout structure may form such as a GGNMOS, the first doped region 130 (source region) and the second doped region 140 (drain region) are N-type doped regions, the third doped region 150 is a P-type doped region, and the gate conductive layer 120 and the first doped region 130 (source region) are both connected to a P-type body region.

According to the embodiments of the present disclosure, the third doped region 150 is formed in the substrate and adjacent to the second doped region 140, which is an existing doped region located within the MOS device region. Compared to arranging an external diode outside the MOS device region for providing ESD protection, according to the embodiments of the present disclosure, the internal diode formed from the third doped region 150 and the second doped region 140 located within the MOS device region does not require much extra circuit area and is advantageous to the dissipation of ESD current, thereby improving the ESD protection without largely increasing the circuit size. In some embodiments of the present disclosure, the machine mode (MM) voltage of the layout structure may be improved to be 350-450V.

Furthermore, in the embodiments, the substrate is such as a silicon-on-insulator (SOI) substrate, and the gate conductive layer 120 and the first doped region 130 (source region) are commonly electrically connected to ground and to the body region having the second conductivity as well. Due to the presence of a buried oxide in a SOI substrate, the originally existing regions having opposite conductivities would form a relatively small parasite diode. With the addition of the third doped region 150 inserted within the MOS device region and located adjacent to the second doped region 140 (drain region), the third doped region 150 in combination with the original parasite diode in fact enlarges the junction area of the resulting diode as a whole, and hence the newly-formed diode from the regions 140 and 150 together with the original parasite diode improves the overall ESD protection.

Additionally, the diode formed from the third doped region 150 and the second doped region 140 is located adjacent to the region connected to the input/output pad, from which current is inputted, such that the diode may be turned on more quickly.

In the embodiments, the layout structure 10 may further include a salicide block layer (SAB) 160 formed on the substrate. As shown in FIG. 1, the salicide block layer 160 is formed on the top surface of the substrate. In the embodiment, the salicide block layer 160 is particularly located between the second doped region 140 and the third doped region 150 for electrically isolating the second doped region 140 from the third doped region 150.

Figure 2:
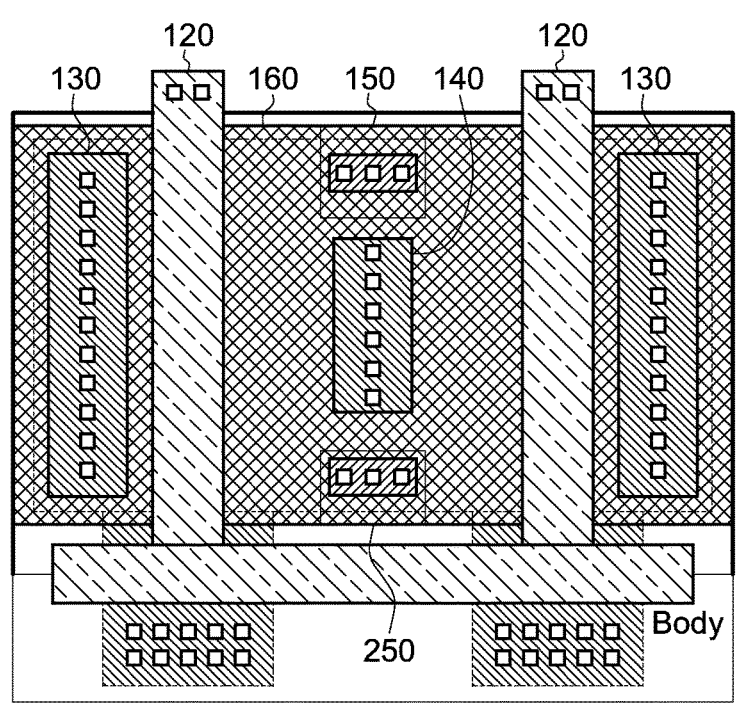
FIG. 2 is a top view of a layout structure according to another embodiment of the present disclosure.

FIG. 2 is a top view of a layout structure 20 according to another embodiment of the present disclosure. The elements in the present embodiment sharing similar or the same labels with those in the previous embodiment are similar or the same elements, and the description of which is omitted.

As shown in FIG. 2, the layout structure 20 includes a substrate (not shown in FIG. 2), a gate conductive layer 120, a first doped region 130 having a first conductivity, a second doped region 140 having the first conductivity, a third doped region 150 having a second conductivity, and an additional third doped region 250 having the second conductivity. The gate conductive layer 120, the first doped region 130, the third doped region 150, and the additional third doped region 250 are connected to ground, and the second doped region 140 is connected to an input/output pad.

In the embodiments, the additional third doped region 250 is formed in the substrate. The second doped region 140 is formed between the third doped region 150 and the additional third doped region 250. Further, the second doped region 140 is located adjacent to the third doped region 150 and the additional third doped region 250. In the embodiments, the doping properties, such as doping materials and/or doping concentrations, of the doped regions 150 and 250 may be substantially the same.

As shown in FIG. 2, the layout structure 20 may as well include the silicide block layer 160. In the present embodiment, the silicide block layer 160 is formed on the top surface of the substrate and exposes the first doped region 130, the second doped region 140, the third doped region 150, and the additional third doped region 250.

Figure 3A:
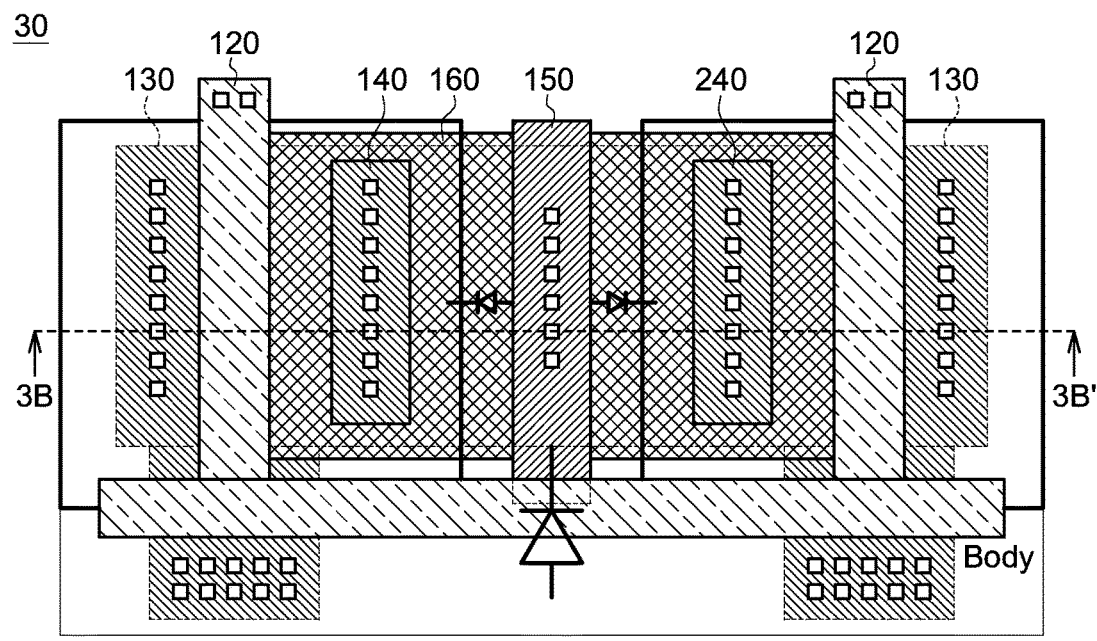
FIG. 3A is a top view of a layout structure according to a further embodiment of the present disclosure.
Figure 3B:
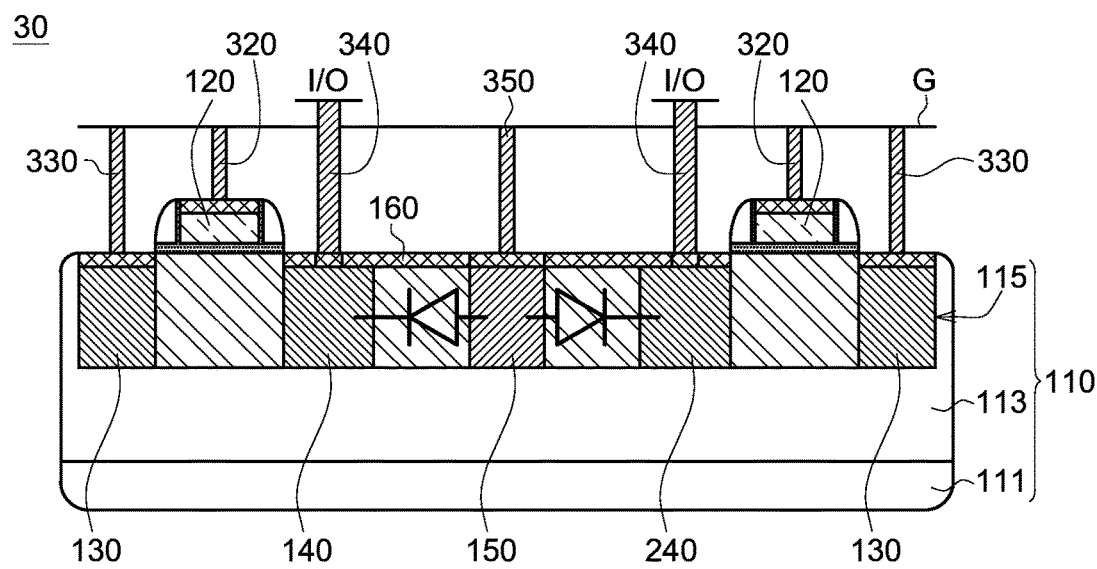
FIG. 3B is a cross-sectional view along the cross-section line 3B-3B' in FIG. 3A.

FIG. 3A is a top view of a layout structure 30 according to a further embodiment of the present disclosure, and FIG. 3B is a cross-sectional view along the cross-section line 3B-3B' in FIG. 3A. The elements in the present embodiment sharing similar or the same labels with those in the previous embodiment are similar or the same elements, and the description of which is omitted.

As shown in FIGS. 3A-3B, the layout structure 30 includes a substrate 110, a gate conductive layer 120, a first doped region 130 having a first conductivity, a second doped region 140 having the first conductivity, a third doped region 150 having a second conductivity, and an additional second doped region 240 having the first conductivity. The additional second doped region 240 is formed in the substrate 110. The gate conductive layer 120, the first doped region 130, and the third doped region 150 are connected to ground G. The second doped region 140 and the additional second doped region 240 are connected to an input/output pad I/O.

As shown in FIG. 3A, the third doped region 150 is formed between the second doped region 140 and the additional second doped region 240. Further, the third doped region 150 is located adjacent to the second doped region 140 and the additional second doped region 240. In the embodiments, the doping properties, such as doping materials and/or doping concentrations, of the doped regions 140 and 240 may be substantially the same.

As shown in FIG. 3B, the layout structure 30 may further include a plurality of contact plugs 320, 330, 340, and 350. The contact plugs 320, 330, 340, and 350 respectively electrically connected to the gate conductive layer 120, the first doped region 130, the second doped region 140, and the third doped region 150. As shown in FIG. 3B, the second doped region 140 is electrically connected to the input/output pad I/O via the contact plug 340. The gate conductive layer 120, the first doped region 130, and the third doped region 150 are commonly electrically connected to ground via the contact plugs 320, 330 and 350.

It is to be noted that the arrangement of the contact plugs 320, 330, 340, and 350, as shown in FIG. 3B, wherein the contact plugs 320, 330, 340, and 350 are respectively electrically connected to the gate conductive layer 120, the first doped region 130, the second doped region 140, and the third doped region 150, can be applied in other embodiments of the present disclosure, despite lacking individual drawings for each of the embodiments.

In the embodiments, as shown in FIG. 3B, the substrate 110 is a SOI substrate including a base substrate 111 having the second conductivity, a buried oxide 113 formed on the base substrate 111, and a semiconductor material 115 formed on the buried oxide 113. The doping regions described herein are formed in the semiconductor material 115 and are separated from the base substrate 111 by the buried oxide 113.

Figure 4A:
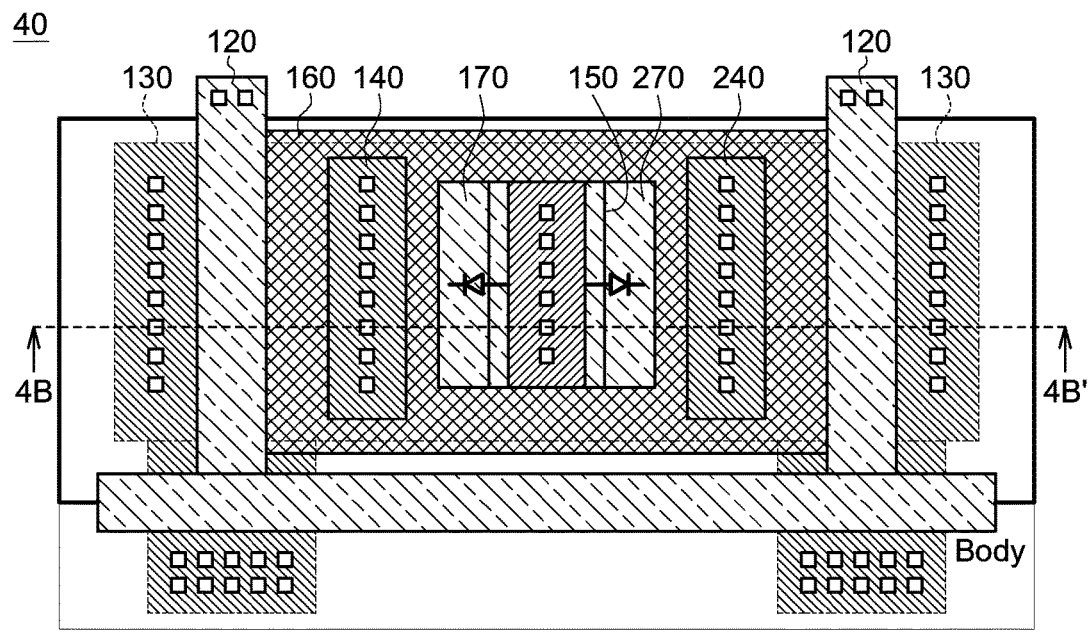
FIG. 4A is a top view of a layout structure according to a still further embodiment of the present disclosure.
Figure 4B:
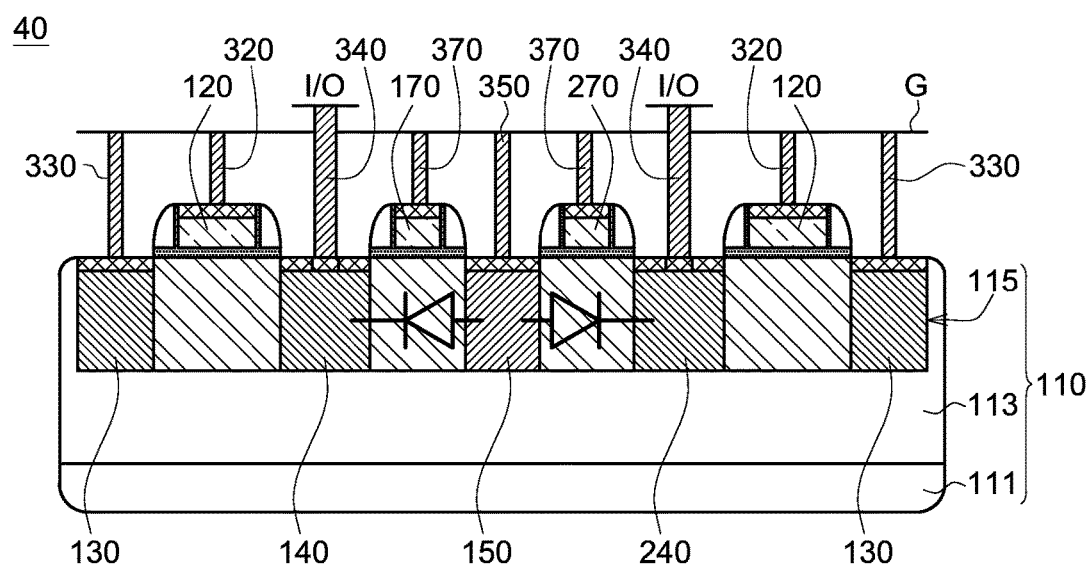
FIG. 4B is a cross-sectional view along the cross-section line 4B-4B' in FIG. 4A.

FIG. 4A is a top view of a layout structure 40 according to a still further embodiment of the present disclosure, and FIG. 4B is a cross-sectional view along the cross-section line 4B-4B' in FIG. 4A. The elements in the present embodiment sharing similar or the same labels with those in the previous embodiment are similar or the same elements, and the description of which is omitted.

As shown in FIGS. 4A-4B, the layout structure 40 includes a substrate 110, a gate conductive layer 120, a first doped region 130 having a first conductivity, a second doped region 140 having the first conductivity, a third doped region 150 having a second conductivity, an additional second doped region 240 having the first conductivity, and at least a conductive layer 170. The conductive layer 170 is formed on the substrate 110. As shown in FIG. 4A, the conductive layer 170 is located between the second doped region 140 and the third doped region 150. The gate conductive layer 120, the first doped region 130, the third doped region 150, and the conductive layer 170 are connected to ground G. The second doped region 140 and the additional second doped region 240 are connected to an input/output pad I/O.

In the embodiments, as shown in FIGS. 4A-4B, the layout structure 40 may include an additional conductive layer 270 and an additional second doped region 240 having the first conductivity. The additional conductive layer 270 is formed on the substrate 110, and the additional second doped region 240 is formed in the substrate 110. As shown in FIG. 4A, the additional conductive layer 270 is located between the additional second doped region 240 and the third doped region 150. In the embodiments, the conductive properties, such as materials, of the conductive layers 170 and 270 may be substantially the same.

In the present embodiment, the conductive layers 170 and 270 may be regarded as dummy gates; that is, the conductive layers 170 and 270 are not used as gates. In the present embodiment, the conductive layers 170 and 270 may also be electrically connected to the gate conductive layer 120, such that the diode may be a gated diode; that is, a gate-controlled diode. In other words, for the layout structures without the conductive layers 170 and/or 270 connected to the gate conductive layer 120, the as-formed diodes are non-gated diodes.

In the embodiments of the present disclosure, the length of the conductive layer 170 may be substantially equal to or larger than the length of the third doped region 150. Likewise, the length of the additional conductive layer 270 may be substantially equal to or larger than the length of the third doped region 150. In the present disclosure, as shown in FIG. 4A, the length of the conductive layer 170 is substantially equal to the length of the third doped region 150.

As shown in FIG. 4B, the layout structure 40 may further include a plurality of contact plugs 320, 330, 340, 350, and 370. The contact plugs 320, 330, 340, 350, and 370 respectively electrically connected to the gate conductive layer 120, the first doped region 130, the second doped region 140 and the additional second doped region 240, the third doped region 150, and the conductive layer 170 and the additional conductive layer 270.

In the embodiments, as shown in FIG. 4B, the second doped region 140 and the additional second doped region 240 are electrically connected to the input/output pad I/O via the contact plugs 340. The gate conductive layer 120, the first doped region 130, and the third doped region 150 are commonly electrically connected to ground via the contact plugs 320, 330, 350. Additionally, the conductive layers 170 and the additional conductive layer 270 may be commonly electrically connected to ground via the contact plugs 370.

Figure 5:
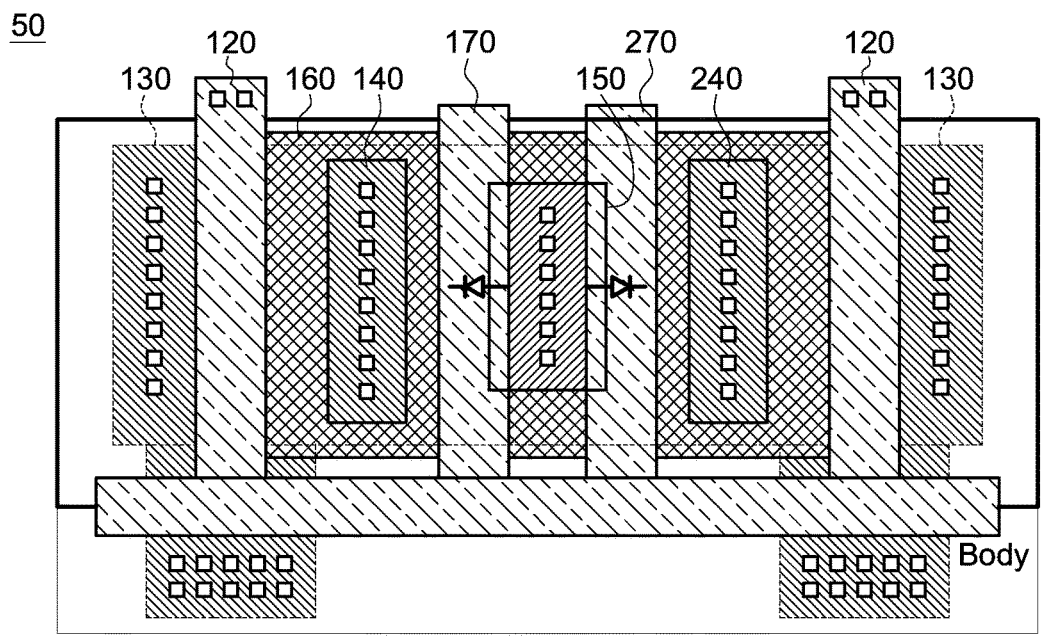
FIG. 5 is a top view of a layout structure according to an additional embodiment of the present disclosure.

FIG. 5 is a top view of a layout structure 50 according to an additional embodiment of the present disclosure. The elements in the present embodiment sharing similar or the same labels with those in the previous embodiment are similar or the same elements, and the description of which is omitted.

As shown in FIG. 5, in the present embodiment, the length of the conductive layer 170 is larger than the length of the third doped region 150. Likewise, the length of the additional conductive layer 270 is larger than the length of the third doped region 150.

Figure 6:
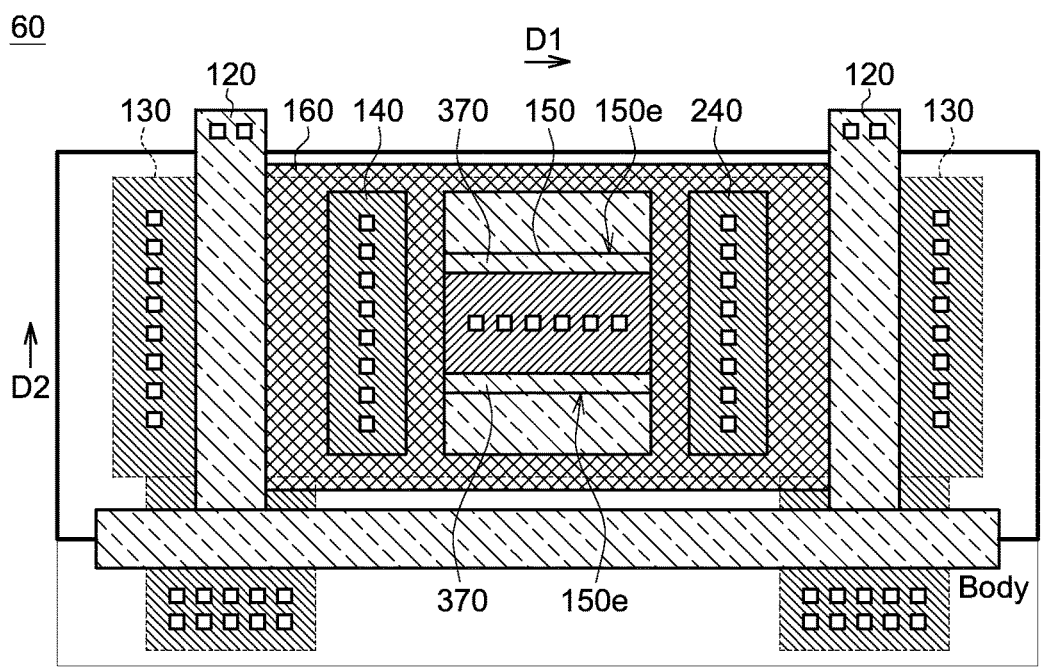
FIG. 6 is a top view of a layout structure according to another additional embodiment of the present disclosure.

FIG. 6 is a top view of a layout structure 60 according to another additional embodiment of the present disclosure. The elements in the present embodiment sharing similar or the same labels with those in the previous embodiment are similar or the same elements, and the description of which is omitted.

As shown in FIG. 6, the layout structure 60 includes a substrate (not shown in FIG. 6), a gate conductive layer 120, a first doped region 130 having a first conductivity, a second doped region 140 having the first conductivity, a third doped region 150 having a second conductivity, two conductive layers 370, and optionally an additional second doped region 240 having the first conductivity. As shown in FIG. 6, the two conductive layers 370 are formed on the substrate, and the third doped region 150 is located between the two conductive layers 370. The gate conductive layer 120, the first doped region 130, the third doped region 150, and the two conductive layers 370 are connected to ground. The second doped region 140 and the additional second doped region 240 are connected to an input/output pad.

In the embodiment, as shown in FIG. 6, the two conductive layers 370 may respectively overlap the two opposite edges 150e of the third doped region 150.

In the embodiment, as shown in FIG. 6, an extending direction D1 of the two conductive layers 370 is substantially perpendicular to an extending direction D2 of the gate conductive layer 120. Moreover, the lengths of the conductive layers 370 may be substantially equal to the length of the third doped region 150 along the direction D1.

Figure 7:
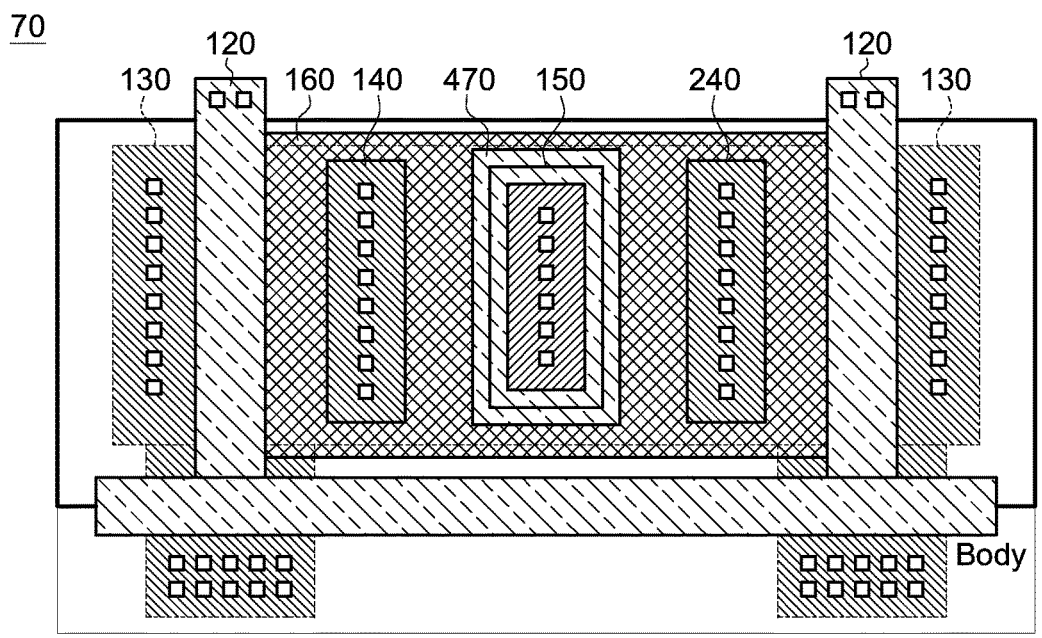
FIG. 7 is a top view of a layout structure according to a further additional embodiment of the present disclosure.

FIG. 7 is a top view of a layout structure 70 according to a further additional embodiment of the present disclosure. The elements in the present embodiment sharing similar or the same labels with those in the previous embodiment are similar or the same elements, and the description of which is omitted.

As shown in FIG. 7, the layout structure 70 includes a substrate (not shown in FIG. 7), a gate conductive layer 120, a first doped region 130 having a first conductivity, a second doped region 140 having the first conductivity, a third doped region 150 having a second conductivity, a conductive layer 470, and optionally an additional second doped region 240 having the first conductivity. As shown in FIG. 7, the conductive layer 470 is formed on the substrate, and the conductive layer 470 surrounds the third doped region 150. The gate conductive layer 120, the first doped region 130, the third doped region 150, and the conductive layer 470 are connected to ground. The second doped region 140 and the additional second doped region 240 are connected to an input/output pad.

In the embodiment, as shown in FIG. 7, the conductive layer 470 is located between the second doped region 140 and the additional second doped region 240. Moreover, as shown in FIG. 7, the conductive layer 470 may partially overlaps the third doped region 150.

Figure 8:
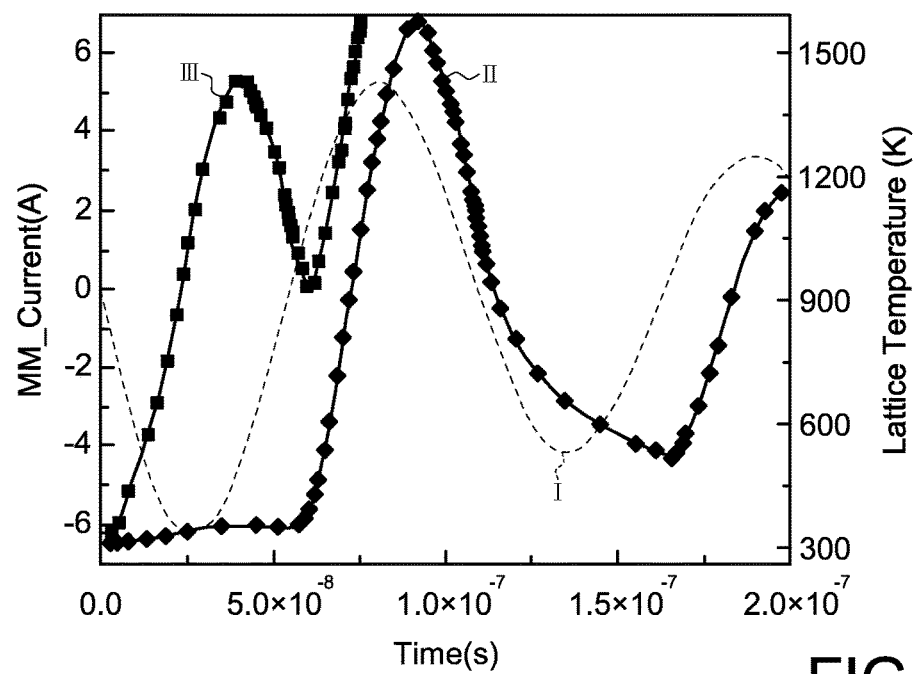
FIG. 8 shows MM (machine mode) TCAD simulation results according to a comparative embodiment and an embodiment of the present disclosure.

FIG. 8 shows MM (machine mode) TCAD simulation results according to a comparative embodiment and an embodiment of the present disclosure.

As shown in FIG. 8, curve I represents the machine mode (MM) waveform of current vs. time at −300V, curve II represents the MM TCAD simulation result of time vs. lattice temperature of a layout structure of an embodiment of the present disclosure, and curve III represents the MM TCAD simulation result of time vs. lattice temperature of a layout structure of a comparative embodiment. The major difference between the structures of the embodiment and the comparative embodiment lies in that the structure of the comparative embodiments lacks the third doped region 150, thereby lacking the newly-formed diode from the third doped region and a drain region.

As indicated in FIG. 8, curve III reaches a very high lattice temperature in the very beginning and goes beyond 1500K after reaching a certain time point. It indicates that hot spot is generated within the structure at the certain time point, causing damages to the structure. On the contrary, curve II shows that the lattice temperature can remain relatively low and never go beyond 1500K, and hence no hot spot would be generated, causing no damage to the layout structure. The above simulation results show that in the layout structure of the embodiment, due to the improved ESD protection provided by the diode formed from the third doped region 150 and the second doped region 140, generation of hot spot within the structure can be prevented, the possibility of structure damage is reduced, and therefore the stability and reliability of the layout structure is improved.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A layout structure, comprising:
   a substrate;
   a gate conductive layer formed on the substrate;
   a first doped region having a first conductivity and a second doped region having the first conductivity formed in the substrate and located at two sides of the gate conductive layer;
   a third doped region having a second conductivity formed in the substrate and adjacent to the second doped region, wherein the third doped region and the second doped region form a diode, the gate conductive layer, the first doped region and the third doped region are connected to ground, and the second doped region is connected to an input/output pad;
   a conductive layer formed on the substrate, wherein the conductive layer is located between the second doped region and the third doped region as viewed from a top view perspective, wherein a length of the conductive layer is equal to a length of the third doped region;
   an additional conductive layer formed on the substrate, wherein the conductive layer and the additional conductive layer are both connected to ground; and
   a salicide block layer formed on the substrate, wherein the salicide block layer is located between the second doped region and the third doped region.

2. The layout structure according to claim 1, wherein the substrate is a silicon-on-insulator (SOI) substrate.

3. The layout structure according to claim 1, further comprising:
   an additional second doped region having the first conductivity formed in the substrate, wherein the third doped region is formed between and adjacent to the second doped region and the additional second doped region.

4. The layout structure according to claim 1, further comprising:
   an additional second doped region having the first conductivity formed in the substrate, wherein the additional conductive layer is located between the additional second doped region and the third doped region.

5. The layout structure according to claim 1, wherein the third doped region is located between the conductive layer and the additional conductive layer.

6. The layout structure according to claim 1, wherein the first conductivity is N type, and the second conductivity is P type.

7. The layout structure according to claim 1, further comprising:
   a plurality of contact plugs respectively electrically connected to the gate conductive layer, the first doped region, the third doped region, and the second doped region.

8. The layout structure according to claim 1, wherein the first doped region is a source region, and the second doped region is a drain region.

9. The layout structure according to claim 1, wherein the gate conductive layer is formed of polysilicon.

* * * * *